(12) United States Patent
Jansson et al.

(10) Patent No.: US 9,743,509 B2
(45) Date of Patent: Aug. 22, 2017

(54) INVERTER TYPE MOTOR DRIVE

(75) Inventors: Peter Sven Jansson, Sodertalje (SE); Anders Lars Uddner, Tyreso (SE)

(73) Assignee: INMOTION TECHNOLOGIES AB, Stockholm (SE)

( * ) Notice: Subject to any disclaimer, the term of this patent is extended or adjusted under 35 U.S.C. 154(b) by 1691 days.

(21) Appl. No.: 13/159,743

(22) Filed: Jun. 14, 2011

(65) Prior Publication Data

US 2012/0007535 A1 Jan. 12, 2012

(30) Foreign Application Priority Data

Jun. 21, 2010 (EP) ..................................... 10166658

(51) Int. Cl.
| | |
|---|---|
| *H02M 7/00* | (2006.01) |
| *H05K 1/02* | (2006.01) |
| *H05K 1/14* | (2006.01) |
| *H05K 3/00* | (2006.01) |

(52) U.S. Cl.
CPC .......... *H05K 1/0263* (2013.01); *H02M 7/003* (2013.01); *H05K 1/144* (2013.01); *H05K 3/0061* (2013.01); *H05K 2201/042* (2013.01); *H05K 2201/10166* (2013.01); *H05K 2201/10272* (2013.01)

(58) Field of Classification Search
USPC .................................................. 363/144–147
See application file for complete search history.

(56) References Cited

U.S. PATENT DOCUMENTS

| | | | | |
|---|---|---|---|---|
| 5,939,835 | A | * | 8/1999 | Takeda et al. ............ 315/209 R |
| 6,181,590 | B1 | | 1/2001 | Yamane et al. |
| 6,215,681 | B1 | | 4/2001 | Schuurman |
| 6,618,278 | B2 | * | 9/2003 | Suzuki et al. ................ 363/144 |
| 7,046,535 | B2 | | 5/2006 | Rodriguez |
| 7,471,534 | B2 | | 12/2008 | Andersson |
| 2005/0105277 | A1 | * | 5/2005 | Frisch .......................... 361/716 |
| 2006/0039127 | A1 | * | 2/2006 | West ............................ 361/803 |
| 2006/0274561 | A1 | * | 12/2006 | Ahmed et al. ................ 363/132 |
| 2008/0232073 | A1 | * | 9/2008 | Nakakita et al. ............. 361/760 |

FOREIGN PATENT DOCUMENTS

WO 94/14227 6/1994

\* cited by examiner

*Primary Examiner* — Jeffrey Gblende
(74) *Attorney, Agent, or Firm* — Park, Vaughan, Fleming & Dowler LLP

(57) ABSTRACT

It is presented an inverter type motor drive device for feeding three phase AC electric power to an electric motor, the inverter type motor drive device comprising: an insulated metal substrate board on which, for each of the three phases, a plurality of power switches are mounted in straight lines in switch assemblies along a first direction; a printed circuit board on which a plurality of capacitors are mounted; and two DC power input terminals. The inverter type motor drive device further comprises three AC power output terminals, each extending through the printed circuit board while avoiding galvanic contact with the printed circuit board, and each of the three AC power output terminals comprise an elongated AC busbar, wherein a longitudinal direction of the AC busbar extends along the first direction.

10 Claims, 4 Drawing Sheets

INVERTER TYPE MOTOR DRIVE

RELATED APPLICATIONS

This application claims priority under 35 U.S.C. §119 to European Patent Application No. 10166658.4 entitled "INVERTER TYPE MOTOR DRIVE" by the same inventors as the instant application filed on 21 Jun. 2010.

TECHNICAL FIELD

The present disclosure relates generally to control of electrical motors, and more particularly to an inverter type motor drive device.

BACKGROUND

Using inverter type motor drive devices, electrical motors can be controlled more freely. Both power and speed can be controlled using such devices.

However, controlling power of electrical motors often require significant currents, especially for low voltage battery operated systems, whereby even relatively small physical distances inside an inverter affect the performance of the motor drive device.

One way to reduce the effect of parasitic impedances is to arrange power switches of the motor drive device radially around the power output.

U.S. Pat. No. 7,248,483 presents an electrical power circuit assembly where bus bars are used between an insulated metal substrate (IMS) printed circuit board (PCB) and a fibreglass PCB. This provides a low parasitic inductance between surface mounted semiconductor power devices on the IMS PCB and filter capacitors on the fibreglass PCB. However, this solution still provides high currents which need to be handled in the assembly.

SUMMARY

An object of the present invention is thus to improve the performance of inverter type motor drive devices.

According to a first aspect of the invention, it is presented an inverter type motor drive device for feeding or receiving three phase AC electric power to or from an electric motor, the inverter type motor drive device comprising: an insulated metal substrate board on which, for each of the three phases, a plurality of power switches are mounted in straight lines in switch assemblies along a first direction, wherein two switch assemblies are assigned for each phase; a printed circuit board on which a plurality of capacitors are mounted, wherein the printed circuit board is essentially parallel to the insulated metal substrate board; and two DC power input terminals mounted on the printed circuit board. The motor drive device is characterised in that the inverter type motor drive device further comprises three AC power output terminals mounted on the insulated metal substrate board, wherein each of the three AC power output terminals extend through the printed circuit board while avoiding galvanic contact with the printed circuit board, and each of the three AC power output terminals comprise an elongated AC busbar mounted to the insulated metal substrate board, wherein a longitudinal direction of the AC busbar extends along the first direction; and each of the two DC power input terminals comprise an input DC busbar, wherein the input DC busbar extends along the first direction.

By avoiding galvanic contact between the three AC power output terminals and the PCB, the high AC currents are prevented from going through the PCB and are instead supplied using an AC power output terminal mounted directly on the insulated metal substrate board.

Each one of the switch assemblies may be divided into a plurality of switch groups, wherein each switch group comprises a plurality of switches arranged in parallel.

The switch groups may be arranged such that, during operation, each switch group of the same switch assembly receives a substantially equal amount of current.

Each switch group may be galvanically connected to either a first or a second of the two DC power input terminals and each switch group may be galvanically connected to a switch group galvanically connected to the other of the first or the second of the two DC power input terminals, wherein each such a set of two connected switch groups makes up a switch group chain.

Each switch group chain may be connected to at least one of the plurality of capacitors, wherein each of the plurality of capacitors may be assigned to one switch group chain.

The printed circuit board may further comprise through slits, the through slits extending in a direction which is essentially perpendicular to the first direction.

Since the insulated metal substrate board can be mounted to a heat sink which can be made of metal and the power terminals are made of metal, the metal parts can physically expand or contract more or less than the PCB when the temperature varies since the thermal expansion coefficient is different for the metal than for the PCB. The slits in the PCB allow for expansion of the PCB while reducing tension of the PCB or between the PCB and other components fixed to the PCB.

The inverter type motor drive device may further comprise a heat sink thermally connected to the insulated metal substrate board.

The inverter type motor drive device may further comprise DC bus bars, each electrically connected to the printed circuit board and the insulated metal substrate board, wherein the DC bus bars extend along the first direction.

Each of the three AC power output terminals may comprise a plurality of mounting supports on which a control printed circuit board is mounted.

The control printed circuit board may be fastened to the two DC power input terminals.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF DRAWINGS

The invention is now described, by way of example, with reference to the accompanying drawings, in which.

DETAILED DESCRIPTION

The present invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
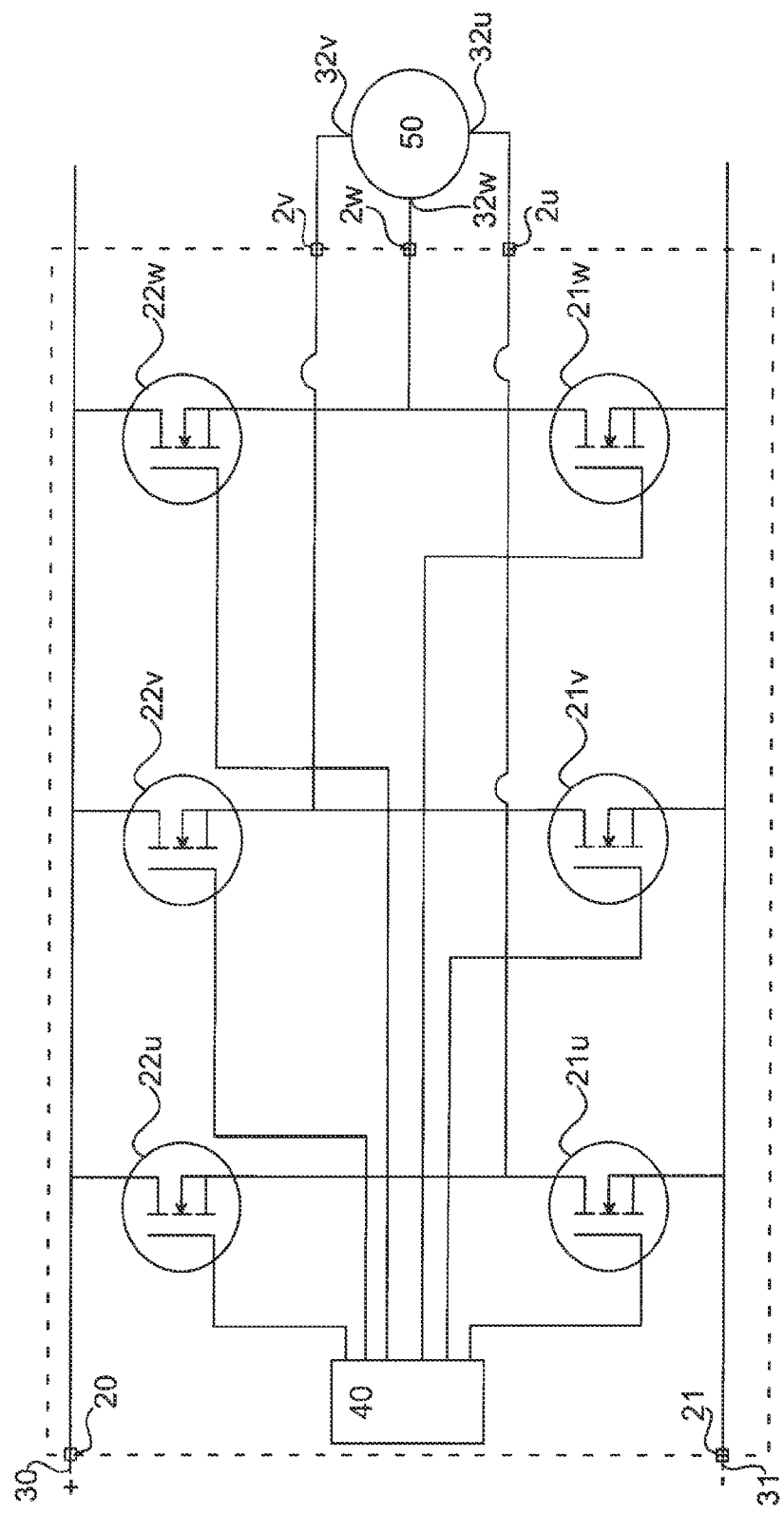
FIG. 1 is a schematic diagram of a motor drive device circuit according to an embodiment of the present invention.

FIG. 1 is a schematic diagram of a motor drive device 1 circuit according to an embodiment of the present invention.

A three-phase electric motor 50, such as an asynchronous motor or a permanent magnet synchronous motor, is powered through three AC (Alternating Current) inputs 32u, 32v, 32w. The motor 50 can be used for any suitable purpose, where one example is to drive a vehicle. In such a context the vehicle could be provided with two or more systems as shown in FIG. 1 to drive two or more wheels of the vehicle, respectively. Another application can be a motor 50 that is mounted onto a diesel motor output shaft and used as a generator.

To allow control of frequency and power supplied to the motor 50, the motor drive device 1 comprises bridge leg where the outputs 2u, 2v, 2w are switched between a positive DC voltage 30 and a negative DC voltage 31. The difference in voltage between the positive and the negative DC voltages 30, 31 typically ranges between 24 and 80 volts or even up to 900 volts. The positive and negative DC voltages can be symmetrical or asymmetrical on either side of zero volts, or either one of the DC voltages 30, 31 could be zero. The DC voltages 30 and 31 can in turn be created from a rectified AC source or from another DC source such as a battery or fuel cell. The motor drive device 1 comprises two DC power input terminals 20, 21 for receiving the DC power. The switching is performed in main drive switch assemblies 21u and 22u for a u-phase, in main drive switch assemblies 21v and 22v for a v-phase and in main drive switch assemblies 21w and 22w for a w-phase. Each switch assembly comprises one or more switch groups, as is explained in more detail below. The AC power is output from the motor/generator drive device 1 using three respective AC power output terminals 2u, 2v, 2w.

To achieve desired capacity of the motor drive device 1, the function of each switch assemblies 21u, 21v, 21w, 22u, 22v, 22w is performed by a desired number of actual switches, arranged in parallel as is explained in more detail with reference to FIGS. 6 and 7 below. The power switches of the main drive switch assemblies 21u, 21v, 21w, 22u, 22v, 22w can be MOSFET transistors or insulated-gate bipolar transistors (IGBT) or any other suitable switches.

During operation of the motor 50, each switch of the switch assemblies 21u, 21v, 21w, 22u, 22v, 22w is controlled from an output of a controller 40 to effect pulse width modulation (PWM). The controller 40 can thus control the frequency and power supplied to/from the motor/generator 50.

Figure 2:
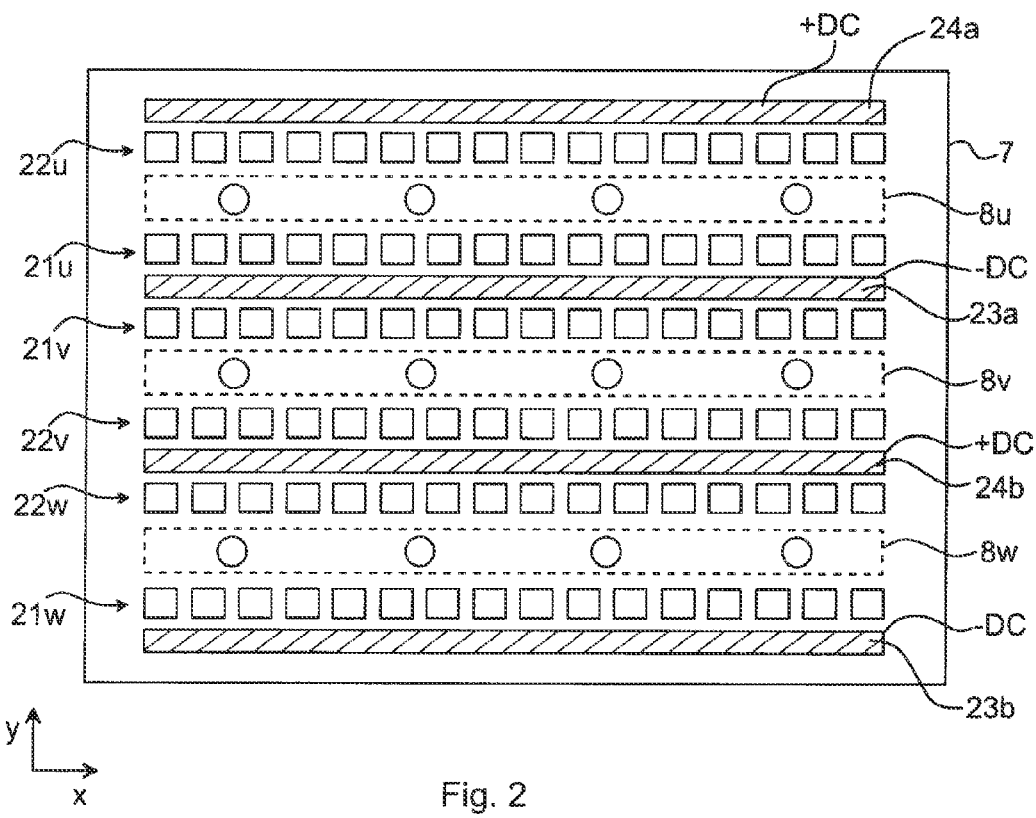
FIG. 2 is a schematic top view of an IMS board of the motor drive device of FIG. 1 and components fastened thereto.

FIG. 2 is a schematic top view of an IMS board 7 of the motor drive device of FIG. 1 and components fastened thereto. Switch assemblies 21u, 21v, 21w, 22u, 22v, 22w are mounted on the IMS board 7. Each of the switch assemblies 21u, 21v, 21w, 22u, 22v, 22w comprises a plurality of switches. In this example, there are sixteen switches in each switch assemblies 21u, 21v, 21w, 22u, 22v, 22w. Within each switch assembly 21u, 21v, 21w, 22u, 22v, 22w, all switches perform the same function and are controlled in parallel by the controller 40 (FIG. 1). The controller is implemented on a separate logic board and the signals from the controller can, for example, be communicated via a parallel interface (not shown) to the IMS board 7.

Four DC distribution busbars 24a, 24b, 23a, 23b are positioned on top of the IMS board 7. Two of these DC distribution busbars 24a, 24b distribute a positive DC voltage while the other two DC distribution busbars 23a, 23b distribute a negative DC voltage. The DC distribution busbars are supplied with DC voltage from the PCB 3 shown in FIG. 3 when the motor drive device is assembled.

In analogy with FIG. 1, switch assemblies 21u and 22u are used for one of the phases, phase u, of the motor 50. The drains of switches of switch assembly 22u are connected to the positive DC voltage via traces on the IMS 7 and via the DC distribution busbar 24a. Analogously, the sources of switches of switch assembly 21u are connected to the negative DC voltage via traces on the IMS 7 and via the DC distribution busbar 23a. Furthermore, the sources of the switches of the switch assembly 22u and the drains of the switches of the switch assembly 21u are connected to traces on the IMS 7 and mounting means 8u for mounting of an AC power output terminal. In use, all mounting means 8u, 8v, 8w have a respective AC power output terminal 2u, 2v, 2w mounted to supply AC power to the motor 50. The gate of all switches of the switch assemblies 22u, 21u are connected to the controller 40.

The other two phases, v and w, are arranged analogously, but each switch assembly is controlled independently by the controller 40.

All of the switches of the switch assemblies 21u, 21v, 21w, 22u, 22v, 22w are thus mounted in straight lines along in the same direction x. The x direction can also be called a first direction. Furthermore, the DC distribution busbars 23a, 23b, 24a, 24b are mounted along the same direction x. Since the DC input and the AC output of the power switches is distributed along the X direction, there is no significant disadvantage to extend along the x direction by installing more power switches. This allows for easy dimensioning of the motor drive device 1 during design. If higher capacity is required, one or more switch groups are simply added, which results in longer DC distribution busbars 23a, 23b, 24a, 24b. Lower capacity is easily accommodated by reducing the number of switch groups and shortening the DC distribution busbars 23a, 23b, 24a, 24b, resulting in a more compact design. Optionally, lower capacity can be achieved by omitting to install some of the switches in each groups while maintaining the size of the IMS board 7, allowing for flexible capacity by only mounting more or fewer power switches.

Figure 3:
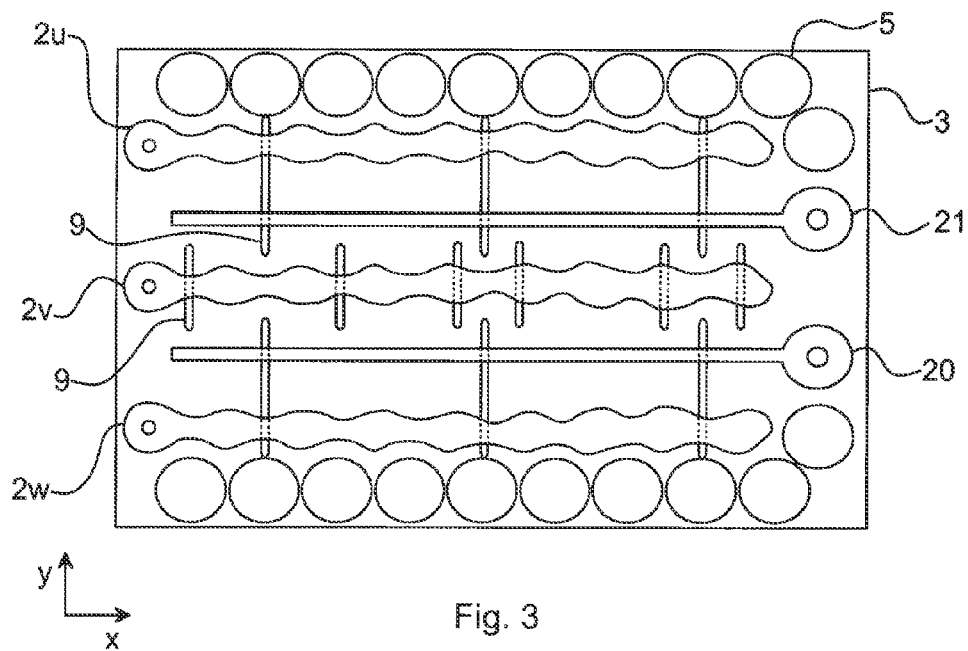
FIG. 3 is a schematic top view of a printed circuit board of the motor drive device of FIG. 1 and components fastened thereto.

FIG. 3 is a schematic top view of a PCB 3 of the motor drive device of FIG. 1 and components fastened thereto. The PCB is mounted to the DC distribution busbars 23a, 23b, 24a, 24b of the IMS board 7. Two DC power input terminals 20, 21 are mounted on the PCB 3 and are connected through the PCB to the DC distribution busbars 23a, 23b, 24a, 24b. The positive DC power input terminal 20 is connected to the positive DC busbars 24a, 24b while the negative DC power input terminal 21 is connected to the negative DC busbars 23*a*, 23*b*. Furthermore, three AC power output terminals 2*u*, 2*v*, 2*w* are provided, but without galvanic contact with the PCB 3. The AC power output terminals 2*u*, 2*v*, 2*w* are mounted to the respective mounting means 8*u*, 8*v*, 8*w* of the IMS board 7, through holes in the PCB 3.

The AC power output terminals 2*u*, 2*v*, 2*w* have an elongated AC busbar which has a cross section of significant size, e.g. 75 mm$^2$ or greater, which reduces the resistance along the x direction to negligible amounts. Analogously, the DC power input terminals 20, 21 have an input DC busbar which has a significant cross section, which also reduces the resistance along the x direction.

A plurality of DC bus capacitors 5 are mounted on the PCB in parallel with the input DC terminals. The capacitors 5 smooth the input voltage to supply a more stable power and filter any DC ripple current. Furthermore, any inductance, e.g. due to long connecting cables, is reduced by the capacitors 5.

The slits in the PCB are made in the y direction. The DC ripple current will also in this design flow in the y direction. Therefore, the slits will not affect the distribution of DC ripple current.

Furthermore, the DC bus bars 23*a*, 23*b*, 24*a*, 24*b* and the IMS 7 are designed such that the voltage drop in the x direction is greatly reduced. The PCB 3 is divided up by the slits so each switch group of switches is primarily connected to the DC bus capacitors 5 connected to the corresponding PCB area within slits. Thereby the switches of the switch assemblies 21*u*, 21*v*, 21*w*, 22*u*, 22*v*, 22*w* dynamically and statically share the current equally with a minimum of variation.

The AC busbars are designed to have a large cross sectional area to reduce resistance while at the same time avoiding being in physical contact with the capacitors 5. This results in a somewhat wavy appearance which corresponds to the capacitors 5. While this is particularly applicable to the upper part of AC power output terminal 2*u* and the lower part of AC power output terminal 2*w*, the same design can be applied to all three AC power output terminals 2*u*, 2*v*, 2*w*.

Since the IMS board 7 can be mounted to a heat sink which can be made of metal and the power terminals 20, 21, 2*u*, 2*v*, 2*w* are made of metal, the metal parts can physically expand or contract more or less than the PCB when the temperature varies. To allow for expansion of the PCB without significant tension, a number of through slits 9 are provided in the PCB 3.

Both the DC busbars and the AC busbars have varying cross-sectional area to achieve a substantially constant voltage drop per unit of distance.

Figure 6:
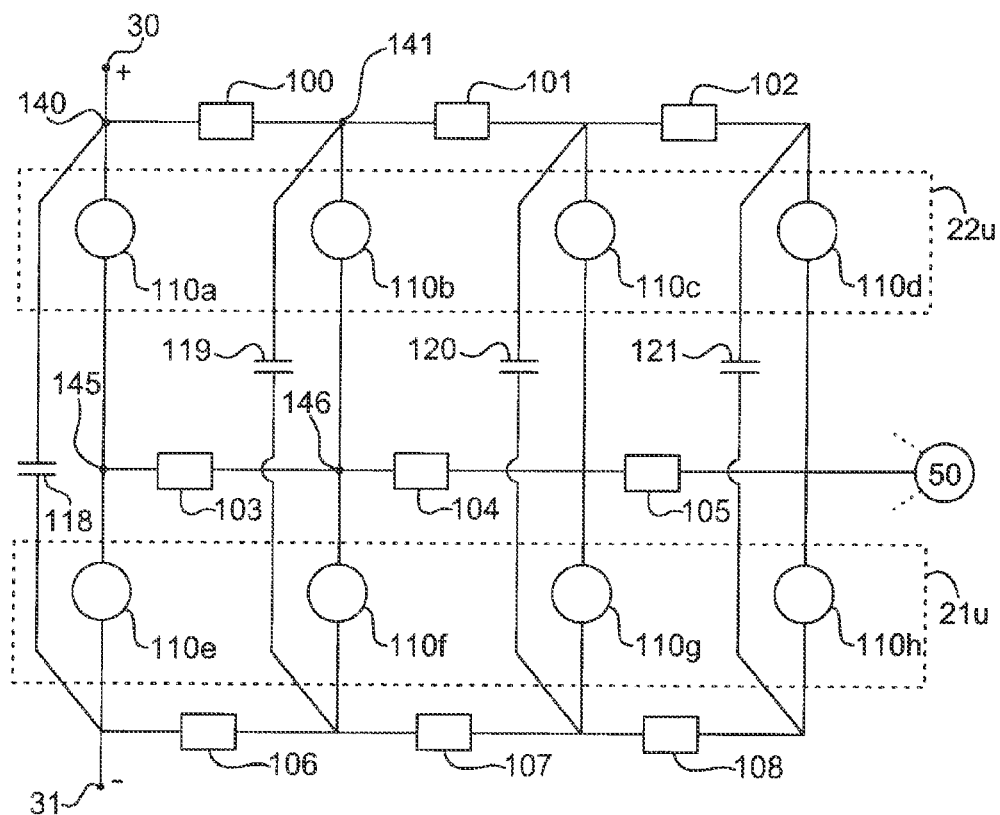
FIG. 6 is a schematic diagram showing electrical aspects of one phase of the embodiment of FIG. 1.
Figure 7:
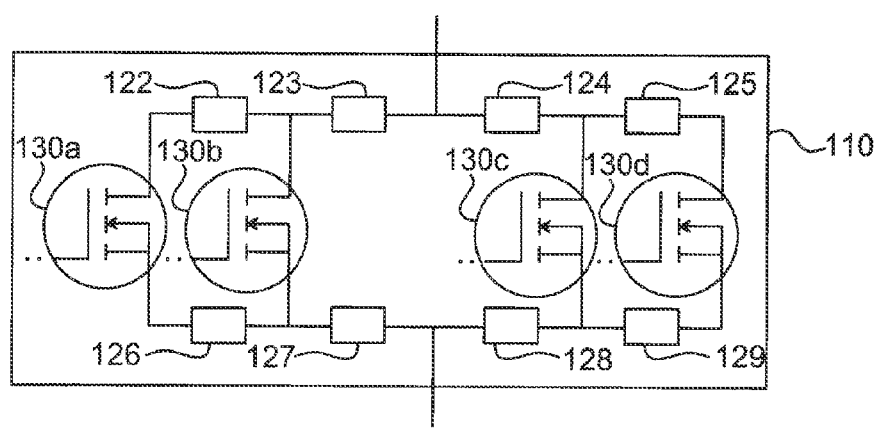
FIG. 7 is a schematic diagram showing electrical aspects of one switch group of FIG. 6.

FIG. 6 is a schematic diagram showing electrical aspect of one switch phase of the embodiment of FIG. 1 and FIG. 7 illustrate one of the switch groups of FIG. 6. These will now be discussed together to explain the layout of transistors in embodiments of the present invention. In order to show the impedances that affect the distribution of current, switch groups 110*a-d* together make up switch assembly 22*u* and switch groups 110*e-h* together make up switch assembly 21*u*. Each switch group 110*a-h*, indicated in FIG. 7 by the reference numeral 110, consists of, in this example, four switches 130*a*-130*d* for a total of sixteen switches for each of switch assemblies 22*u* and 21*u*. Each switch group is connected to one connection point on the DC distribution busbar and one connection point on the AC busbar.

Each switch assembly is arranged such that static and dynamic distribution of current becomes very similar for all transistors. By dividing each switch assembly into switch groups, each group becomes small, i.e. occupying a small amount of space on the IMS 7, whereby parasitic impedances 122-129 become small. It is to be noted, that while four switch groups are shown for each switch assembly in this example, the number of groups can be varied, e.g. in correspondence with current requirements of a particular application.

The voltage drop over impedances 100-102 and 103-105 correspond to each other to achieve an equal distribution of current between the switch groups 110*a-d*. In other words, the voltage drop from point 140 to point 141 correspond to the voltage drop from point 145 to point 146, etc. These voltage drops are due to the impedance of the DC distribution busbar 24*a* and the AC busbar out AC output terminal 2*u*. Analogously, the voltage drop over impedances 106-108 and 103-105 correspond to each other to achieve equal current distribution.

Each set of switch groups connected to +DC 30 and −DC 31 making up a switch group chain, i.e. switch groups 110*a*, 110*e*, switch groups 110*b*, 110*f*, switch groups 110*c*, 110*g*, and switch groups 110*d*, 110*h*, are connected to its own set 118-121 of at least one DC bus capacitor each. All DC bus capacitors of the sets 118-121 are part of the DC bus capacitors 5 of FIG. 3. The capacitor sets 118-121 are isolated using natural stray impedances. In this way, a good and equal current distribution between all switches is achieved. Since the DC bus capacitor sets 118-121 are connected to the switch groups 110*a-h* directly, the impedances reduce effects of switching of neighbouring switch groups.

Consequently, this construction provides an improved current distribution in a static perspective (milliseconds) as well as in a dynamic perspective (microseconds).

It is to be noted that the other two phases, with switch assemblies 22*v*, 21*v*, 22*w*, 21*w* have the same, but independent, configuration as the phase that has been described above comprising switch assemblies 22*u*, 21*u* with reference to FIGS. 6 and 7.

Figure 4:
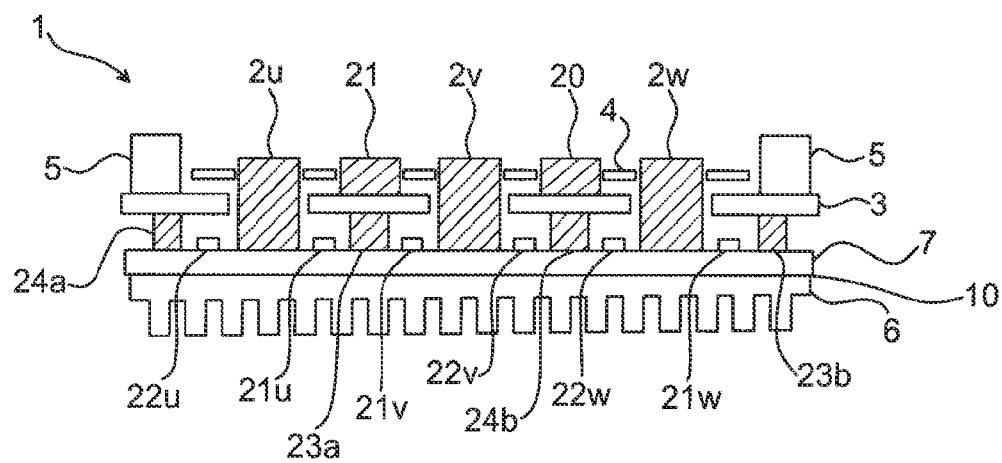
FIG. 4 is a schematic side view of the motor drive device circuit according to FIG. 1.

FIG. 4 is a schematic side view of the motor drive device circuit according to FIG. 1. Here the PCB 3 and the IMS board 7 can be seen. A logic board 4 is also provided, upon which components are mounted which perform the function of the controller 40. A heat sink 6 is thermally connected to the IMS board 7 to dissipate heat, e.g. generated from the power switches. In order to further increase the thermal contact between the IMS 7 and the heat sink 6, thermal grease 10 may be applied.

A functional explanation will now be provided for the phase u. Positive DC power is provided on the DC power input terminal 20, which is supplied through the PCB 3 to the two positive DC distribution busbars 24*a* and 24*b*. Analogously, negative DC power is provided on the DC power input terminal 21 and supplied through the PCB 3 to the two negative DC distribution busbars 23*a* and 23*b*. Under PWM control from the controller (FIG. 1), the switch assembly 22*u* supplies positive DC voltage or not to the AC power output terminal 2*u*, while the switch assembly 21*u* supplies negative DC voltage or not to the AC power output terminal 2*u*. The AC power output terminal 2*u* is then connected to one phase of the motor (FIG. 1) while avoiding routing any AC output current through the PCB.

The other phases v, w work the same way as phase u, but each phase is individually controlled by the controller.

Figure 5:
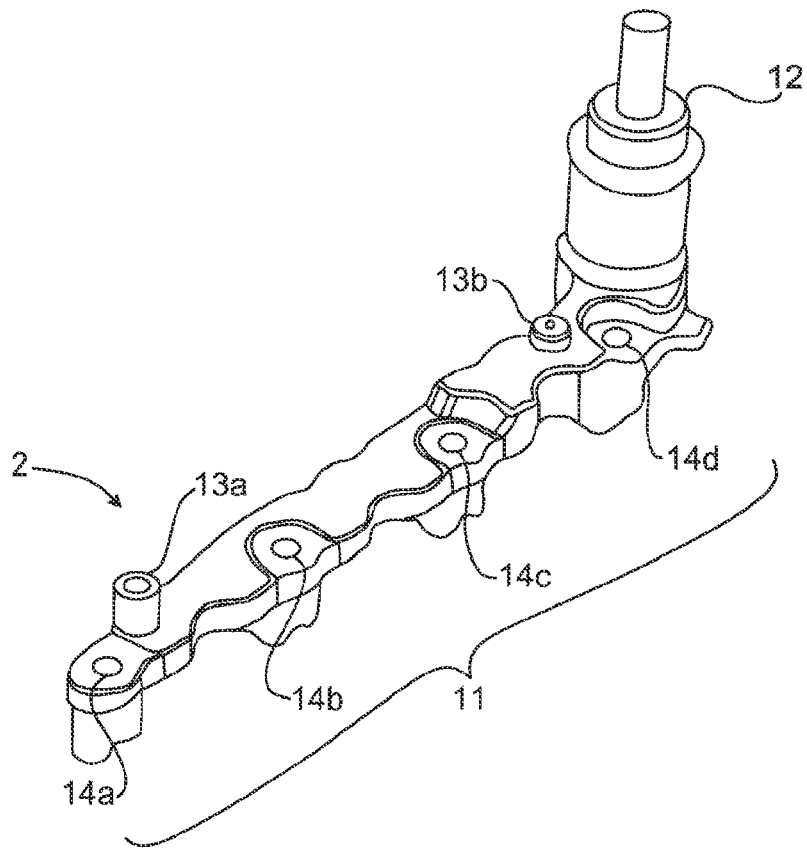
FIG. 5 is a schematic perspective view of an AC power output terminal of the motor drive device of FIG. 1.

FIG. 5 is a schematic perspective view of an AC power output terminal 2 of the motor drive device of FIG. 1. An AC busbar 11 collects AC power as supplied by connected power switches. The AC power output terminal 2 is mounted e.g. using screws (not shown) extending via through holes 14a, 14b, 14c, 14d and extending through the holes in corresponding mounting means (8u, 8v, 8w of FIG. 2) on the IMS board 7 to the heat sink 6.

Furthermore, the AC power output terminal 2 can be provided with mounting supports 13a, 13b for the logic board 4, even though the logic board is powered from the DC power input terminals.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An inverter type motor drive device for feeding or receiving three phase AC electric power to or from an electric motor, the inverter type motor drive device comprising:

an insulated metal substrate board on which, for each of the three phases, a plurality of power switches are mounted in straight lines in switch assemblies, wherein two switch assemblies are assigned for each phase, and wherein the switch assemblies for all three phases are oriented along a first direction;

a printed circuit board on which a plurality of capacitors are mounted, wherein the printed circuit board is essentially parallel to the insulated metal substrate board; and two DC power input terminals mounted on the printed circuit board;

wherein the inverter type motor drive device further comprises three AC power output terminals mounted on the insulated metal substrate board, wherein each of the three AC power output terminals extend through the printed circuit board while avoiding galvanic contact with the printed circuit board, and each of the three AC power output terminals comprise an elongated AC busbar mounted to the insulated metal substrate board, wherein a longitudinal direction of the AC busbar extends along the first direction;

wherein each of the two DC power input terminals comprise an input DC busbar, wherein the input DC busbar extends along the first direction.

2. The inverter type motor drive device according to claim 1, wherein each one of the switch assemblies is divided into a plurality of switch groups, wherein each switch group comprises a plurality of switches arranged in parallel.

3. The inverter type motor drive device according to claim 2, wherein the switch groups are arranged such that, during operation, each switch group of the same switch assembly receives a substantially equal amount of current.

4. The inverter type motor drive device according to claim 2, wherein each switch group is galvanically connected to either a first or a second of the two DC power input terminals and each switch group is galvanically connected to a switch group galvanically connected to the other of the first or the second of the two DC power input terminals, wherein each such a set of two connected switch groups makes up a switch group chain.

5. The inverter type motor drive device according to claim 4, wherein each switch group chain is connected to at least one of the plurality of capacitors, wherein each of the plurality of capacitors is assigned to one switch group chain.

6. The inverter type motor drive device according to claim 1, wherein the printed circuit board further comprises through slits, the through slits extending in a direction which is essentially perpendicular to the first direction.

7. The inverter type motor drive device according to claim 1, further comprising a heat sink thermally connected to the insulated metal substrate board.

8. The inverter type motor drive device according to claim 1, further comprising DC bus bars, each electrically connected to the printed circuit board and the insulated metal substrate board, wherein the DC bus bars extend along the first direction.

9. The inverter type motor drive device according to claim 1, wherein each of the three AC power output terminals comprises a plurality of mounting supports on which a control printed circuit board is mounted.

10. The inverter type motor drive device according to claim 9, wherein the control printed circuit board is fastened to the two DC power input terminals.

* * * * *